United States Patent [19]

Withers

[11] 4,435,462

[45] Mar. 6, 1984

[54] INFRA-RED DETECTOR ELEMENTS

[75] Inventor: Richard B. Withers, Romsey, England

[73] Assignee: U.S. Philips Corporation, New York, N.Y.

[21] Appl. No.: 319,776

[22] Filed: Nov. 9, 1981

Related U.S. Application Data

[60] Continuation of Ser. No. 179,339, Aug. 18, 1980, abandoned, which is a division of Ser. No. 59,831, Jul. 23, 1979, Pat. No. 4,301,591.

[30] Foreign Application Priority Data

Jul. 31, 1978 [GB] United Kingdom ............... 31750/78

[51] Int. Cl.³ ............................................. B32B 3/00
[52] U.S. Cl. .................................... 428/156; 428/157; 428/172
[58] Field of Search ......................... 428/156, 157, 172

Primary Examiner—Bernard D. Pianalto
Attorney, Agent, or Firm—Jack E. Haken

[57] ABSTRACT

An infra-red radiation detector element and its manufacture. The detector element has a mesa (31) of infra-red sensitive material, e.g. cadmium mercury telluride, with separate metal electrodes (64 and 55, see FIG. 17) formed on side-walls of the mesa (31) from a metal layer 33. This permits a significant proportion of the current flow occurring between the electrodes (64 and 55) in operation of the element to pass across the bulk of the mesa (31) between its side-walls and not adjacent its top surface where the carrier recombination velocity may be higher. The mesa (31) is formed by ion-etching using a masking layer (24) e.g. of photoresist, and this permits reproducible etching over a uniform depth and the obtaining of a topographically rough surface to which the subsequently-deposited metal layer (33) can have good adhesion. The electrodes are formed from this layer (33) by a lift-off technique using the same masking layer (24). The ion-etch definition of the mesa (31) can also be used to etch unmasked parts of a passivating layer (14) on the element surface without any significant undercutting.

7 Claims, 23 Drawing Figures

INFRA-RED DETECTOR ELEMENTS

This is a continuation of application Ser. No. 179,339, abandoned, filed Aug. 18, 1980, which is a division of Ser. No. 059,831, filed July 23, 1979 now U.S. Pat. No. 4,301,591.

The invention relates to methods of manufacturing infra-red detector elements, particularly but not exclusively of cadmium mercury telluride, and further relates to infra-red detector devices comprising at least one detector element.

BACKGROUND OF THE INVENTION

U.S. Pat. Nos. 3,977,018 and 4,037,311 disclose methods of manufacturing an infra-red detector element including the steps of forming a masking layer on part of a surface of a body of infra-red sensitive material, depositing metal on said masking layer and on a surface part of said body not covered by said masking layer, and removing said masking layer to lift away the metal thereon and leave the metal on said surface part for forming separate electrodes of said detector element. In both these patent specifications the masking layer is of photoresist which can be removed by dissolving in a suitable solvent such as acetone.

During operation, the resulting detector elements exhibit a high current density near the facing electrode-extremities defined by the removal of the masking layer. Sometimes these facing extremities of the electrodes are not sharply defined by the metal lift-off process; furthermore in these elements this high current density occurs adjacent part of the body surface between the electrodes, and the free charge-carrier recombination velocity may be high adjacent this surface in spite of passivation.

In both said patent specifications the photoresist masking layer is provided on part of a passivating layer formed at the surface of said body, for example by anodising. Before depositing the metal, the masking layer is used as a mask in a process for entirely removing the unmasked parts of the passivating layer so as to expose surface parts of the body for contacting by the electrodes. The process disclosed in U.S. Pat. No. 4,037,311 is a polishing process using a lapping cloth and a fine abrasive; the applicant has now found, however, that such abrasion can damage the surface of the infra-red sensitive material by introducing recombination centres within the sensitive area of the detector element. The anodic passivating layer is removed in U.S. Pat. No. 3,997,018 with a buffered hydrofluoric acid solution; however, the applicant has found that chemical etchant solutions also etch the passivating layer under the edge of the masking layer so that the metal electrodes left on removal of the masking layer may not adjoin the remaining passivating layer and may leave an area of unpassivated infra-red sensitive material where the high current density occurs in operation of these elements.

All these factors can adversely affect the low frequency (l/f) noise characteristics, and detectivity (D*) of detector element manufactured by these previous methods.

SUMMARY OF THE INVENTION

According to a first aspect of the present invention a method of manufacturing an infra-red detector element including the steps of forming a masking layer on part of a surface of a body of infra-red sensitive material, depositing metal on said masking layer and on a surface part of said body not covered by said masking layer, and removing said masking layer to lift away the metal thereon and leave the metal on said surface part for forming separate electrodes of said detector element, is characterised in that, before depositing said metal, infra-red sensitive material is removed from said surface by ion-etching while using said masking layer as an etchant mask so as to form a mesa of infra-red sensitive material topped by said masking layer, and in that metal which is deposited on side-walls of said mesa during the deposition is left for forming said separate electrodes after the removal of said masking layer.

According to a second aspect of the invention there is provided a method of manufacturing an infra-red detector element including the steps of:
 (a) forming a masking layer on part of a surface of a body of infra-red sensitive material,
 (b) using ion-etching to remove said material from said surface while using said masking layer as an etchant mask so as to form a mesa of infra-red sensitive material topped by said masking layer,
 (c) depositing metal on said masking layer and on side-walls of said mesa, and
 (d) removing the said masking layer to lift away the metal thereon and leave the metal on the side-walls of said mesa for forming separate electrodes of said detector element.

Ion-etching is a known process by which a surface is eroded by bombardment with high energy particles obtained by accelerating ionised atoms or molecules, at least some of which may be neutralized with electrons before reaching the surface. Ion energies of a few hundred to several thousand eV are generally used.

By using such energies, unmasked surface parts of bodies of infra-red sensitive material such as, for example, cadmium mercury telluride can be readily etched in a reproducible manner over a uniform depth of, for example, at least 0.5 micron to produce well-defined mesas while the effect on the resulting body surface need not significantly increase the low frequency (l/f) noise or reduce the detectivity (D*). The ion-etching of the surface part subsequently contacted by the metal electrodes results, however, in a topographically rough surface to which the electrodes can have a strong adhesion, even when the metal is deposited by evaporation. A major advantage is that since the electrodes comprise the metal deposited on the side-walls of said mesa the high current density which occurred in the previous devices adjacent the surface part between the electrode extremities can be reduced, and a significant proportion of the current flow occurring between the electrodes in operation of the element can pass across the bulk of said mesa between its side-walls and not adjacent its top surface where the carrier recombination velocity may be higher. Furthermore the applicant has found that the ion-etching which forms the mesa can also be used to etch unmasked parts of a passivating layer on the body surface without any significant etching of the passivating layer under the edge of the masking layer. Thus a detector element can be readily formed by such a technique so as to have a passivating layer which is present over the top of the mesa and is adjoined at the edge by separate metal electrodes on the side-walls of the mesa.

Because of these features detector elements manufactured by such methods in accordance with the invention can have good detectivity D* and small low frequency (l/f) noise.

According to a third aspect of the present invention an infra-red detector device is characterised in that the active area is provided by a mesa of the infra-red sensitive material, and in that metal electrodes contact said material at side-walls of the mesa without contacting the top of said mesa.

In order to illustrate the realisation of these and other aspects and features in accordance with the invention and their advantages, embodiments of the invention will now be described, by way of example, with reference to the accompanying diagrammatic drawings, in which:

It should be noted that the figures in the accompanying drawings are not drawn to scale; the relative dimensions and proportions of some parts of the figures have been greatly exaggerated or reduced for the sake of clarity. In particular the thickness of the various layers in relation to their lateral extent is much smaller than may otherwise be apparent from the drawings. The same reference numerals as used in one figure are generally used to refer to the same or similar parts in other figures and embodiments.

DESCRIPTION OF THE PREFERRED EMBODIMENTS

In the method now to be described with reference to FIGS. 1 to 17, the starting material is a crystal wafer 1 of cadmium mercury telluride, $Cd_{1-x}Hg_xTe$ where $0<x<1$. The material is sensitive to infra-red radiation, and the atomic ratio of cadmium to mercury may be such as to produce a cut-off wavelength for the material of for example approximately 12 microns. The dimensions of the starting wafer are not critical but should be sufficient to provide the large number of detector elements to be manufactured therefrom, for example over a thousand elements; the wafer may be circular with a diameter of for example 10 mm.; its thickness may be for example 0.5 mm.

Figure 1:
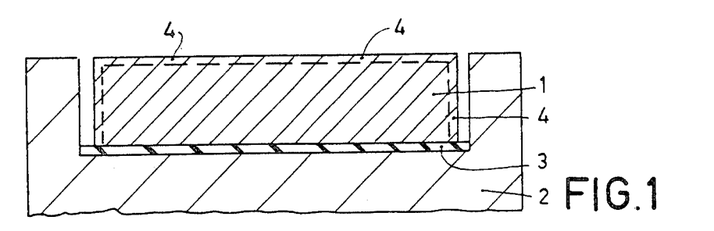
FIG. 1 is a cross-sectional view of a wafer of cadmium mercury telluride mounted on a polishing block at an early stage in the manufacture of an infra-red detector element by a method in accordance with both the first and second aspects of the invention.

The wafer 1 is mounted on a polishing block 2, for example by a layer of wax 3. The thickness of the wafer 1 projecting above shoulders of the block 2 is then lapped away and its exposed major surface is polished in known manner. The resulting wafer thickness may now be for example 200 microns. Preferably the final polishing stage involves a chemical etching treatment to remove surface damage. The polished surface and the side of the wafer 1 are now provided with a passivating layer 4, for example by anodic oxidation in known manner. The resulting arrangement is illustrated in FIG. 1.

Figure 2:
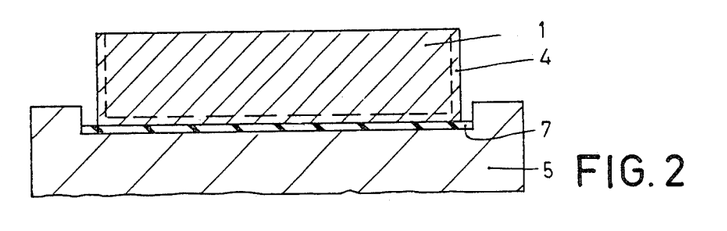
FIG. 2 is a cross-sectional view of the wafer mounted on another polishing block at a subsequent step in the method.
Figure 3:
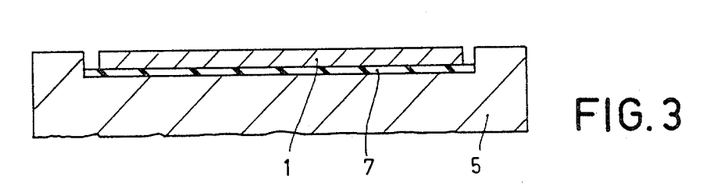
FIG. 3 is a cross-sectional view of the wafer after thinning on said other polishing block.

The wafer 1 is now removed from the block 2 and adhered via its anodized major surface to another polishing block 5, for example with a layer of wax 7. Although the passivating layer 4 is shown in FIGS. 1 and 2, it is omitted in subsequent figures for the sake of convenience. The thickness of the wafer 1 projecting above shoulders of the block 5 is then lapped away and its exposed major surface is polished in known manner. The resulting wafer thickness may now be for example 15 microns. The resulting arrangement is illustrated in FIG. 3.

Figure 4:
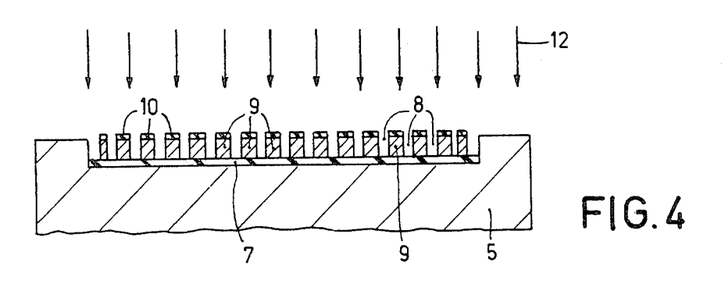
FIG. 4 is a cross-sectional view of the thinned wafer on said other polishing block at a subsequent ion-beam etching step for forming strip portions from the wafer.
Figure 5:
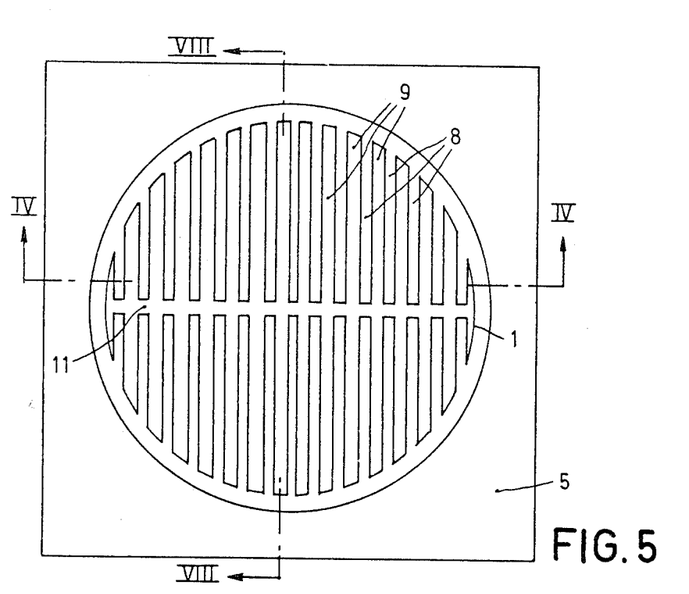
FIG. 5 is a plan view of the thinned wafer on said other polishing block after the ion-beam etching step, the cross-section of FIG. 4 being taken along the line IV—IV of FIG. 5.

A layer of photoresist is then provided on the thinned wafer 1 and is selectively exposed and developed to provide a photoresist masking layer 10. The pattern of the layer 10 corresponds to the pattern of interconnected strip portions 9 illustrated in FIG. 5. The photoresist may be for example that commercially available under the trade name Shipley resist AZ 1350H of Shipley Chemicals Limited. An etching treatment is then effected using the layer 10 as an etchant mask so as to form a plurality of slots 8 through the thickness of the wafer 1. As shown in FIGS. 4 and 5 the slots 8 define substantially parallel strip portions 9 of the wafer which are interconnected by an orthogonal strip 11 extending across a diameter of the wafer.

As illustrated in FIG. 4, this etching treatment may be performed by a beam 12 of, for example, argon ions. Such etching is effected in a vacuum chamber with the wafer and block arrangement 1, 5 mounted on a target holder; the target holder may be for example water-cooled and rotatable during the etching treatment. The pressure in the chamber is kept sufficiently low that scattering of the ions is minimal and the surface to be etched is bombarded by the ions at a predetermined angle. The incident ion-beam is obtained from an ion source which may be mounted, for example, at the top of the chamber. The applicant has used a chamber with a saddle-field ion source commercially available from Iontech Limited of Teddington, U.K. Using this ion source, the etching area at a target distance of 5 cm. is found to be 2 sq. cm., and the argon ion current can be up to 45 microamps plus an approximately equivalent dose of neutral argon atoms using a voltage of 5 kV with a source current of 1 m and an argon pressure of $5 \times 10^{-4}$ torr.

The etch rate depends on the beam current, the incident angle of the beam, the energy of the beam and the nature of the target material. The incident angle can be varied by tilting the target holder. For use at different stages of this method of manufacture, the target holder may be at a distance of, for example, 4 cm. from the ion source with an incident beam which may be perpendicular to the surface or inclined at an angle of up to, for example, 45°; under these conditions the applicant has etched cadmium mercury telluride at a rate of approximately 4 microns an hour. The etch rate of the Shipley resist was found to be between 0.1 and 0.3 times that of the cadmium mercury telluride. Therefore approximately 4 hours are needed to etch the slots 8 through the 15 microns thickness of the wafer 1. A typical thickness for the layer 10 is 5 to 7.5 microns. By ion-beam etching in this manner the applicant has found that steep side walls having a slope of, for example, 75° can be achieved. In this way narrow slots 8 can be formed in the wafer 1 so that a large proportion of the wafer can be used to provide the detector elements. The remaining strip portions 9 may be for example 200 microns wide, and the slots 8 may be for example 10 microns wide etched through 10 micron wide windows in the masking layer 10. Although FIG. 5 shows only fourteen such strip portions 9 across the diameter of the wafer it should be understood that there are actually many more present.

Figure 6:
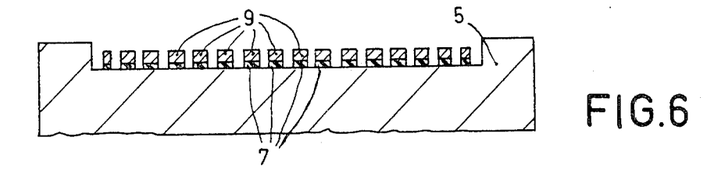
FIG. 6 is a cross-sectional view taken along the same line as FIG. 4 after a thinning and rounding step.
Figure 7:
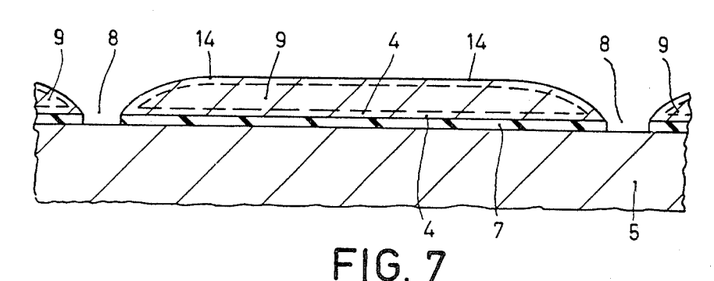
FIG. 7 is a cross-sectional view of parts of three of the strip portions of the wafer after a subsequent anodising treatment.

In the next stage of manufacture the part of the photoresist layer 10 remaining on the strip portions 9 is removed after which the thickness of the strip portions 9 is reduced to for example 10 microns while rounding their exposed longitudinal upper edges. This thickness reduction and rounding may be effected by polishing and etching in a manner such as that described in U.S. Pat. No. 4,037,311. FIG. 6 shows in cross-section the strip portions 9 after the etching process; due to the distortion of the relative dimensions of the drawing the rounding of the longitudinal edges is not apparent in this figure, but it is illustrated in the close-up view of FIG. 7. It should also be noted that the wax layer parts exposed by the slots 8 are removed during the etching of the slots 8 and during the subsequent thinning and rounding treatment.

The exposed upper surface of the strip portions 9 and their side walls are now provided with a passivating layer 14, for example by anodically oxidizing the cadmium mercury telluride surface in known manner. The strip portion 11 serves to interconnect the strip portions 9 during such an anodizing treatment. Both the passivating layers 4 and 14 are illustrated in the close-up cross-sectional view of one such strip portion 9 shown in FIG. 7.

Figure 8:
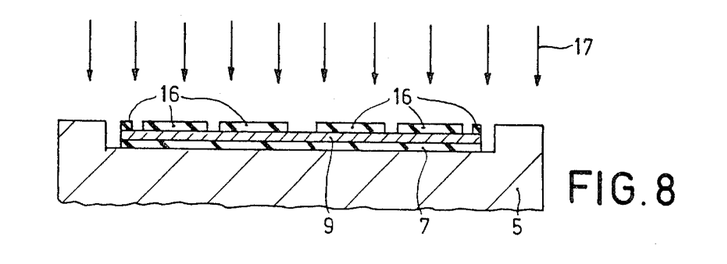
FIG. 8 is a cross-sectional view along the line VIII—VIII of FIG. 5 illustrating the division of a strip portion of the wafer into separate bodies during a further ion-beam etching step.
Figure 9:
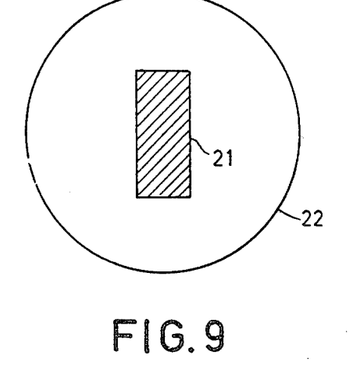
FIG. 9 is a plan view of one such body mounted on a detector substrate in a subsequent step of the manufacture.

A further layer of photoresist is then provided and is selectively exposed and developed to form a masking layer 16 having a pattern for dividing the strip portions 9 along their length into a plurality of separate bodies 21 of infra-red sensitive material. This is effected by etching through the thickness of the portions 9 so as to form slots which extend perpendicular to the slots 8. This etching step also may be effected in a manner similar to that described with reference to FIG. 4 by using a beam 17 or argon ions. This step is illustrated in FIG. 8. The length of each body 21 formed from the strip portions 9 in this embodiment is sufficient to provide a linear array of four detector elements as will now be described with reference to FIGS. 9 to 17. The bodies 21 may thus have for example a length of 250 microns, a width of 200 microns and a thickness of 10 microns.

A body 21 is removed from the polishing block 5 and is mounted on an area of a surface of an insulating substrate 22. The surface of the body 21 passivated by the layer 4 is secured to the surface of the substrate 22, for example by a thin adhesive layer 23 which is illustrated in the cross-sectional views of FIGS. 11, 12 and 15. The substrate 22 may be of optically-polished sapphire. The body 21 is shaded in FIG. 9 for the sake of clarity.

Next a layer of photoresist is provided over the surface of the substrate 22 and body 21, and is selectively exposed and developed to form a first photoresist masking layer 24 on a part of the upper surface of both the body 21 and the substrate 22. The layer 24 consists of a stripe of photoresist which is shown shaded in FIG. 10. The stripe 24 extends locally across the body 21 in a direction substantially perpendicular to those along which the body 21 will subsequently be divided into the desired linear array. The stripe 24 is present on the passivating layer 14 on the body surface where the underlying masked area defines the passivated active area of the detector element; in this active area which may be for example 50 microns wide the infra-red radiation is to be sensed. The areas not masked by the stripe 24 are subsequently provided with a metallization pattern as will be described hereinafter. The stripe 24 determines a separation in the metallization pattern on the body 21 and extends onto the substrate 22 to also separate parts of the metallization pattern where subsequently formed on the substrate 22.

Figure 11:
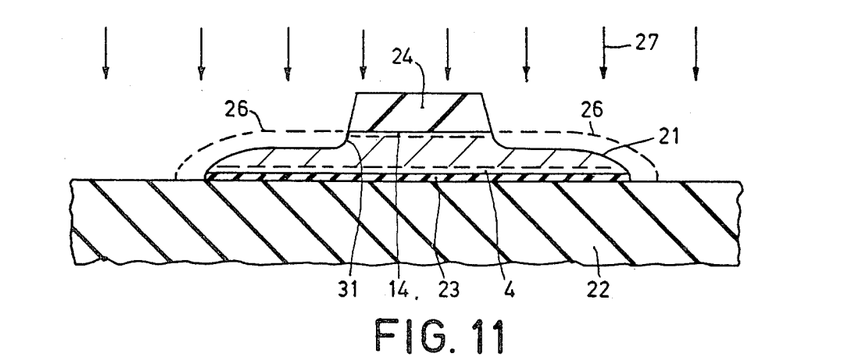
FIG. 11 is a cross-sectional view taken on the line XI—XI of FIG. 10 after forming a mesa at the body surface by ion-beam etching.

Before depositing metal for said metallization pattern a mesa is formed at the body surface by ion-beam etching. This is illustrated in FIG. 11. While using the stripe 24 as an etchant mask the exposed part of the passivating layer 14 and an underlying portion of the infra-red sensitive material is removed by bombardment with a beam 27 of for example argon ions. The etching conditions may be similar to those described previously in connection with FIGS. 4 and 8. However the bombardment is effected for a shorter time so that the etching occurs through only part of the thickness of the body 21. As a result there is formed a mesa 31 upstanding on the remainder of the body 21; this mesa 31 of infra-red sensitive material is topped by the remainder of the masking stripe 24, and the remainder of the passivating layer 14 is present between the top of the mesa 31 and the stripe 24. The broken line 26 in FIG. 11 indicates the original passivated surface of the body 21. The ion bombardment also etches to a lesser extent the photoresist stripe 24 and the exposed surface of the substrate 22, but this is not indicated in the drawing for the sake of simplicity.

I have found that the etch rate of anodic oxide which forms the layer 14 is approximately 1.3 times that of the underlying cadmium mercury telluride, and that there does not occur any significant removal of the layer 14 under the edge of the masking layer 24 during the ion-beam etching; this is important since it is desirable for the layer 14 to adjoin at its edges the subsequently provided metal electrodes. Similarly no significant etching occurs of the layer 4 under the edge of the body 21.

I have found that ion-beam etching permits the mesa 31 to be formed in a reproducible manner with a well-defined shape by uniform removal of cadmium mercury telluride from the unmasked surface parts of the body 21. The cadmium mercury telluride is etched to a uniform depth of at least 0.5 micron and preferably much deeper for example 2 or 3 microns; the resulting structure permits a significant proportion of the current occurring between the detector electrodes in operation of the final detector element to flow across the bulk of the mesa 31 between its side-walls rather than adjacent its top surface. The ion-beam etching permits the side-walls of the mesa 31 to be comparatively steep, for example with a slope of 75°. The factors that control the slope include the angle of the beam 27, the shape and etching of the resist 24 and any redeposition of the ejected target atoms.

Figure 12:
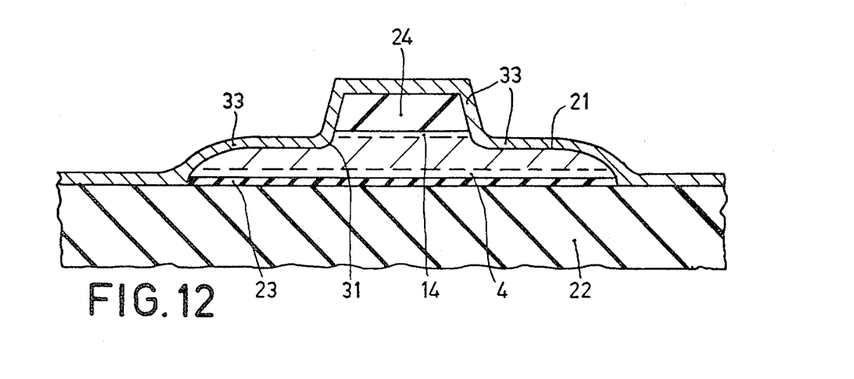
FIG. 12 is a cross-sectional view of the arrangement shown in FIG. 11 after a metal deposition step.

After forming the mesa 31, metal is deposited to form a layer 33 on the photoresist stripe 24, on parts of the body 21 not masked by the stripe 24, and on the area of the surface of the substrate 22 around the body 21. This metal layer 33 is thus deposited on both the side-walls of the mesa 31 and on the surface of the remainder of the body 21. The resulting structure is illustrated in FIG. 12.

Preferably the metal is deposited by evaporation because chromium is difficult to sputter, and evaporation is a relatively cool, low energy process which does no significantly damage the cadmium telluride. I have found that even evaporated metal can have good adhesion to the topographically rough surfaces produced by the ion-beam etching on both the cadmium mercury telluride body 21 and the sapphire substrate 22. However it is of course possible to deposit the metal in other ways, for example by sputtering. I have found it is advantageous for the metal to consist of a first layer of chromium deposited in contact with the infra-red sensitive material (because of the strong adhesion of chromium to both cadmium mercury telluride and sapphire) and a thicker second layer of gold deposited on the chromium layer to reduce the electrical resistance of the metal film; chromium has both a thermal expansion coefficient and a work function compatible to that of cadmium mercury telluride and does not form an amalgam with either mercury or gold at temperatures below approximately 150° C. Such an evaporated gold-chromium layer 33 can have a particularly strong adhesion to both the body 21 and the substrate 22. The chromium may be for example 0.05 micron thick, and the gold may be for example 0.5 micron thick.

Figure 13:
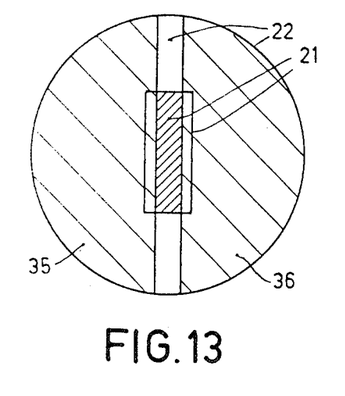
FIG. 13 is a plan view of the arrangement of FIG. 12 after removal of the first masking layer.

The masking layer 24 is then removed to lift away the metal thereon and to leave the remainder of the layer 33 as a metallization pattern 35, 36 on both the body 21 and the substrate 22, as illustrated in FIG. 13. Since the layer 24 is of photoresist it can be removed by immersing in acetone and possibly using agitation to aid the removal in known manner. The remaining metallization pattern consists of two separate parts 35 and 36 each of which extends on the side-walls of the mesa 31 and will be further processed subsequently to form separate detector electrodes contacting these side-walls of the detector elements.

Figure 14:
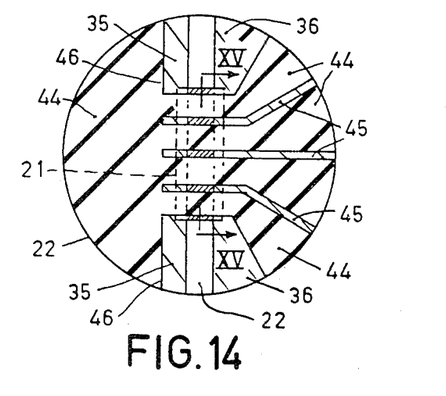
FIG. 14 is a plan view of the arrangement of FIG. 13 after providing a second masking layer for determining the desired pattern of detector elements and their electrodes.

This further processing involves masking and etching the body 21 and the metallization pattern 35, 36 to divide them into a desired pattern of detector elements and their electrodes. For this purpose a second masking layer 44 is provided on most of the metallization pattern 35, 36 and most of the body 21 where not covered by the pattern 35, 36. This layer 44 may also be formed of photoresist such as for example Shipley resist AZ 135OH and has a plurality of stripe-shaped windows which are formed by selective exposure and development of the photoresist.

As shown in FIG. 14, these windows 45 extend substantially parallel to each other across the upper surface of the body 21 and then diverge away from each other across the metallization pattern 35, 36 on the substrate 22. In this way a closely-packed linear array of small detector elements can be formed with large contact pads on the substrate 22 for external connections. The windows 45 extend across the body 21 in a direction substantially perpendicular to that along which the earlier stripe 24 extended; such transverse stripe features in the two masks 24 and 44 provide a comparatively easy way of defining a linear element array in a reproducible manner. The windows 45 expose parts of the body 21 and of the metallization pattern 35, 36 which are now to be removed from the substrate 22 by ion-beam etching.

Figure 15:
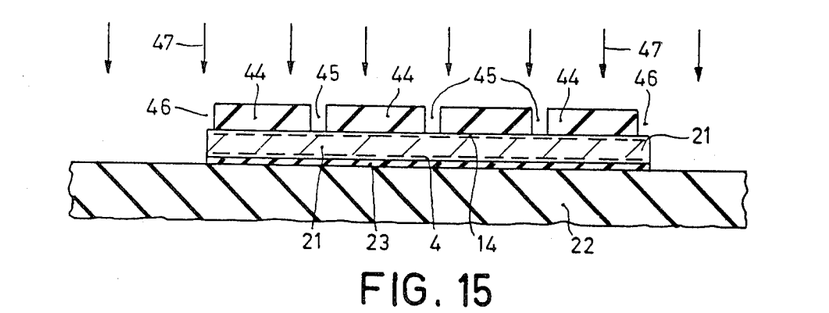
FIG. 15 is a cross-sectional view of the arrangement of FIG. 14 during an ion-beam etching step to form said desired pattern.

This etching may be effected using a beam 47 of argon ions in a manner similar to that described hereinbefore with reference to FIG. 8. The etching is effected throughout the thickness of the body 21 and throughout the thickness of the layer pattern 35, 36 while using the layer 44 as an etchant mask. The width of the stripe-shaped windows 45 may be for example 12.5 microns, and the width of the masked area of the body 21 between adjacent windows 45 may be 50 microns. The steep side-walls produced by ion-beam etching of the cadmium mercury telluride and the only very small underetching which occurs permit the fabrication of a very closely packed array of detector elements from the monolithic body 21; this is a considerable advantage over the use of chemical solutions as etchants. Thus, the spacing between adjacent elements of the array formed in this way may be very small, for example 10 microns.

The argon ions also etch away the exposed metallization in the same etching step. The etching is continued for a sufficiently long time to etch through not only the exposed parts of the body 21, but also through the parts of the body 21 where covered by the exposed parts of the metallization pattern 35, 36. The ion-beam etching also removes the exposed parts of the passivating layer 4 and 14 between the elements of the array without significant lateral etching under the edges of either the masking layer 44 or the resulting elements.

Figure 16:
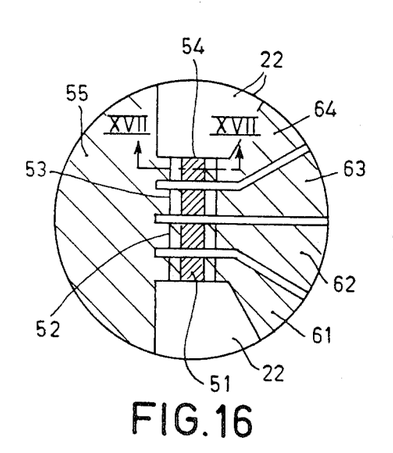
FIG. 16 is a plan view of the resulting detector element array which is in accordance with the third aspect of the invention.
Figure 17:
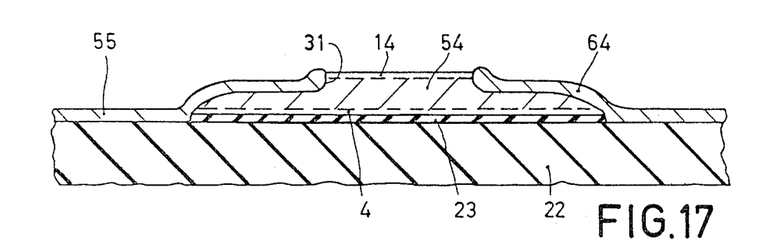
FIG. 17 is a cross-sectional view taken on the line XVII—XVII of FIG. 16.

After removing the second masking layer 44, the resulting detector arrangement is as shown in FIGS. 16 and 17. The group of four detector elements 51, 52, 53 and 54 so formed are arranged as a linear array having on one side a common electrode 55 formed from the metallization pattern part 35 and on the opposite side individual electrodes 61, 62, 63, 64 respectively which are formed from the metallization pattern part 36. Each of these detectors comprises a mesa 31 of the infra-red sensitive material with the separate metal electrodes 55 and for example 64 on the opposite side-walls of the mesa 31, as illustrated for detector element 54 in FIG. 17. This mesa contacting of the elements 51 to 54 results, during operation, in a reduction of the current density which occurs near the extremities of the electrode and adjacent the top surface of the mesa 31; in spite of the passivating layer 14 covering this surface the charge-carrier recombination velocity is generally higher at this surface than in the bulk so a significant advantage can be obtained with this mesa structure (as compared with electrodes on a flat surface) because a significant proportion of the current can flow across the bulk of the mesa 31 between its side-walls. This can lead to significant performance benefits for the detector element, for example less low-frequency noise.

As a result of the ion-beam etching of the passivating layer 14 using the metallization mask 24 as an etchant mask, the passivating layer 14 remaining over the top of the mesa 31 of each detector element 51 to 54 is adjoined at the edge by its separate electrodes 55 and for example 64. Thus, as illustrated in FIG. 17 for detector element 54, no unpassivated infra-red sensitive material is exposed at the top surface adjacent the extremity of the electrodes 55 and for example 64. This also enhances the performance of the detector elements 51 to 54.

The fabrication process described with reference to FIGS. 9 to 17 requires only two masking steps. The first mask 24 determines a metallization pattern and its alignment is not critical. The second mask 44 determines the desired pattern of elements and their electrodes which are formed from the body 21 and the metallization pattern respectively. This process is described and claimed in my patent application Ser. No. 059,380 which is filed on the same day as the present application. Such a process has an advantage in not requiring a critical alignment of separate masking steps, one for dividing the body 21 into elements and another for defining the electrode pattern, in spite of the very small spacing between adjacent elements of the array.

External connections can be made to the elements of the array by bonding wires to the parts of the electrodes 55, 61, 62, 63 and 64 where they are present directly on the substrate 22.

Figure 18:
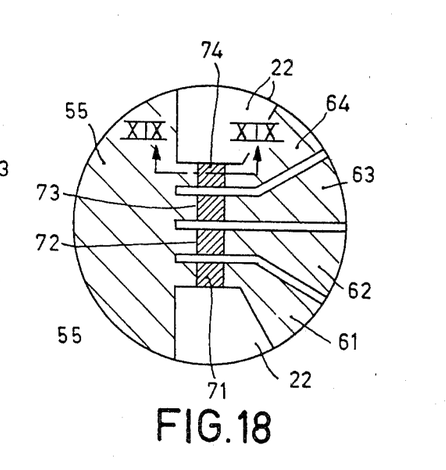
FIG. 18 is a modification of FIG. 16 showing in plan view a detector element array in accordance with the third aspect of the invention and manufactured by a slightly different method also in accordance with both the first and second aspects of the invention.
Figure 19:
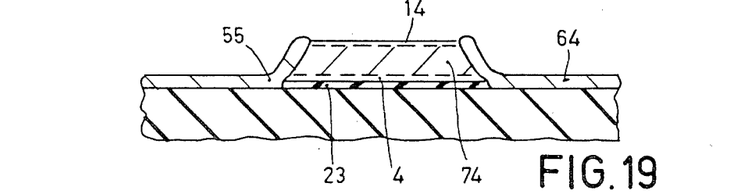
FIG. 19 is a cross-sectional view taken on the line XIX—XIX of FIG. 18.

Many modifications are possible within the scope of the present invention. FIGS. 18 and 19 illustrate one such modification in the fabrication of which the ion-beam etching step illustrated in FIG. 11 has been continued across the whole thickness of the body 21 to the surface of the substrate 22 to shape the body 21 into an upstanding mesa 31 of cadmium mercury telluride which remains standing on the substrate 22 and is topped by the stripe 24 and part of the passivating layer 14. The processing is then continued as described with reference to FIGS. 12 to 15 to form the detector device of FIGS. 18 and 19 having detector elements 71 to 74. In this modified device the contact between the element body and its electrodes 55 and for example 64 is formed wholly by the metal on the side-walls of the mesa, as illustrated in FIG. 19 for element 74. In such a wholly-mesa element a higher proportion of the current can flow across the bulk of the body. Furthermore in the detector of FIGS. 16 and 17 the metallization pattern 35, 36 may be locally weakened where it extends from the edge of the body 21 to the substrate 22, for example if the adhesive layer 23 does not extend all the way to this edge; in the detector of FIGS. 18 and 19, however, such a deficiency in the adhesive layer may be removed by the ion-beam etching of the mesa 31 down to the substrate surface and this can improve the metallization.

Figures 20, 21:
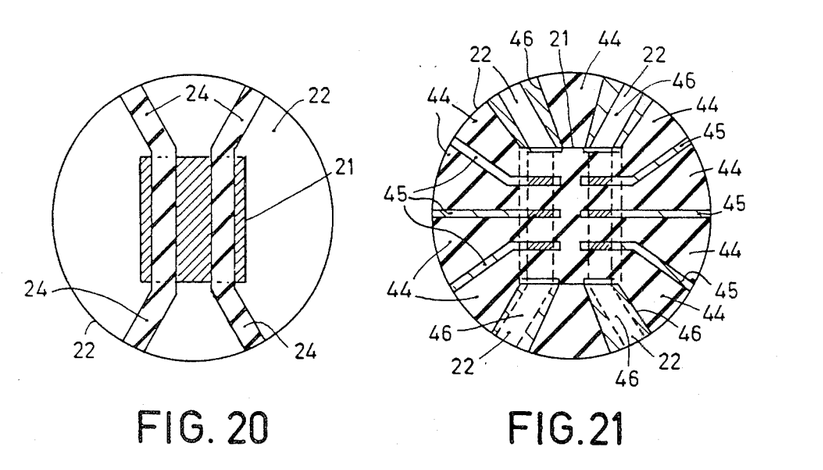
FIG. 20 is a modification of FIG. 10.
FIG. 21 is a modification of FIG. 14 both showing plan views at different steps in the manufacture in accordance with the invention of an element array illustrated in section in FIG. 22.
Figure 22:
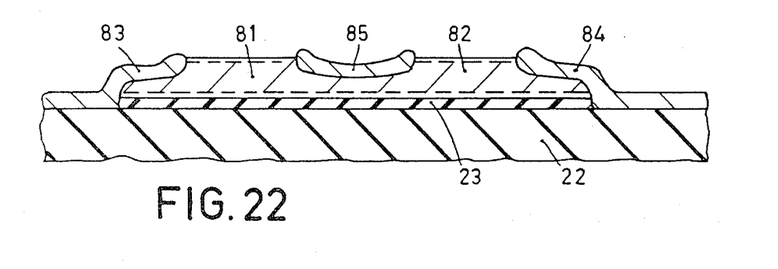

By forming a body 21 of different size and/or by using a different pattern for the first masking layer 24 and/or the second masking layer 44 different groups of detector elements can be formed on the substrate 22. FIGS. 20 to 22 illustrate one example in which the strip portions 9 and hence the bodies 21 formed from the wafer are sufficiently wide to accommodate two back-to-back linear arrays of detector elements which together form a 2-dimensional area array. In this case as shown in FIG. 20, the first masking layer 24 for determining the metallization pattern consists of two photoresist stripes which are parallel to each other along the length of the body 21 and then diverge from each other over the substrate 22. The stripes 24 may each be for example 50 microns wide and may be separated by a distance of for example 100 microns over the body 21. In order to divide the body 21 and metallization pattern into the area array of elements and their electrodes, the second masking layer 44 has a corresponding set of stripe-shaped windows 45 on each side of the body 21, as illustrated in FIG. 21. As shown in FIG. 22, the resulting detector array consists of back-to-back elements such as elements 81 and 82 having individual electrodes such as electrodes 83 and 84 and an intermediate electrode 85 which is common to all the elements and which is defined by the area between the two stripes 24 in FIG. 20. All these elements, e.g. 81 and 82, have a mesa structure which is contacted at its sidewalls by the element electrodes, e.g. 83, 84 and 85.

Instead of forming an array of back-to-back elements as shown in FIG. 22, alternate element areas of each linear array may be removed by the ion-beam etching used to divide the body 21, thereby forming a staggered array of the elements.

Figure 10:
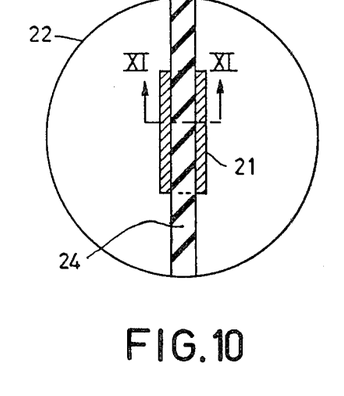
FIG. 10 is a plan view of the arrangement of FIG. 9 after providing a first masking layer.

Instead of forming such a long body 21 as that illustrated in FIGS. 10 and 20, a shorter body 21 may be used and the second masking layer may comprise only one stripe-shaped window 45 so as to form a 2×1 linear array or a 2×2 area array of elements respectively.

Figure 23:
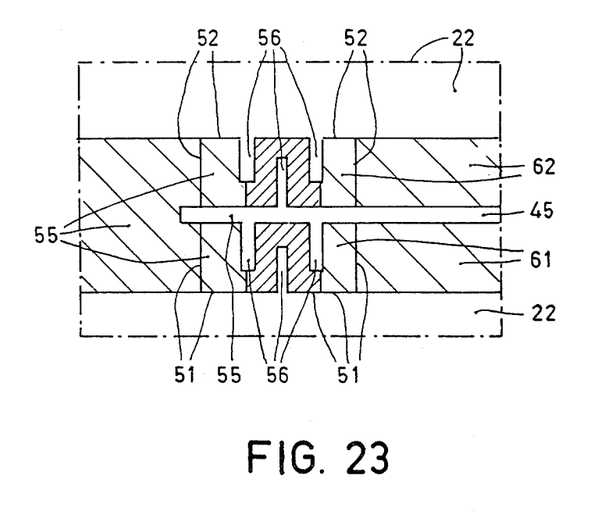
FIG. 23 is a plan view of part of a modified array in accordance with the third aspect of the invention and manufactured by a method in accordance with the first and second aspects.

By approximately changing the shape of the stripe-shaped windows 45 in the second masking layer 44, part of the infra-red sensitive material between where the electrodes are formed can be removed over the whole thickness of the body 21 and across part of the width of each element by ion-beam etching in the same step as that illustrated in FIG. 15, so as to define a current path between the electrodes which extends through the remaining infra-red sensitive material and is longer than the distance along a straight line between the contact areas. Two such modified elements are illustrated in FIG. 23. This technique is described and claimed in another of my co-pending patent applications S.N. 59875 filed on the same day as the present application and the contents of the specification of which are hereby incorporated by reference into the present specification. Thus, the windows 45 where they cross the body 21 may be extended sideways to form a plurality of substantially parallel slots 56 which extend from opposite side walls of the element to form a meandering current path between the electrodes. This longer current path increases the resistance and charge-carrier transit time in the detector element and so can improve the responsivity of the detector.

Instead of dividing the strip portions 9 shown in FIG. 8 into bodies 21 of sufficient size to form a plurality of detector elements, the strip portions 9 may be divided into bodies 21 for forming a single detector element, and the masking, mesa-etching, metallization and lift-off stages illustrated in FIGS. 10 to 13 may be effected while these bodies 21 are still present on the polishing block 5. In this way individual detector element bodies are formed with their electrodes and these can be removed subsequently from the block 5 and assembled in an array on a detector substrate, for example by using a method such as described and claimed in U.S. Pat. No. 4,062,107; in this method interconnections deposited on the substrate can overlap the part of the element electrodes extending laterally over the surface of the remainder of the element body on opposite sides of the upstanding mesa. This is one example where it is an advantage not to etch the mesa throughout the thickness of the body 21.

The ion-beam etching illustrated in FIG. 15 forms exposed sides of the detector elements. These sides can be passivated by subsequently forming a passivating layer in known manner, although it appears to the applicant that the ion-beam etched sides already possess some intrinsic passivation, perhaps as a result of implantation of the inert ions at the surface. Instead of forming a passivating layer 14 on the upper surface of the detector elements before metallization and element definition, the sensitive active areas of the elements and their sides can be passivated by a subsequent treatment.

I have found that ion-beam etching (especially with at least part of the ion beam neutralized with electrons) has proved to be a particularly reproducible etching process for infra-red sensitive materials such as cadmium mercury telluride, while avoiding serious damage to the material. However instead of ion-beaming etching, other equivalent forms of ion-etching may be used, for example so-called "magnetron sputtering" in which the ion flux used for sputter-etching is concentrated by a magnetic field. Magnetron sputtering is described in for example the article entitled "Equipment for sputtering" by A. J. Aronson, Solid State Technology, December 1978, pages 66 to 72, although this article is primarily concerned with sputter-deposition rather than sputter-etching. Other ion-etching processes are described in the articles "An Investigation of Ion-Etching" by H. Dimigen et al., Philips Technical Review, Vol. 35, No. 7/8, pages 199 to 208, and "Introduction to Ion and Plasma Etching" by S. Somekh, Journal Vacuum Science Technology, Vol. 13, No. 5, pages 1003 to 1007.

Instead of forming the detector elements of cadmium mercury telluride, other infra-red sensitive materials may be employed, for example other ternary intermetallic chalcogenides such as for example lead tin telluride or other monocrystalline semiconductors such as for example lead sulphide or indium antimonide.

In the embodiments described hereinbefore the methods comprise the application of ohmic contact electrodes to element bodies having a uniform material composition and for use in detectors of which the operation is based on intrinsic photoconductivity. However also within the scope of the present invention is the manufacture of detector elements each of which has a p-n junction located in the sensitive mesa area of the element body; in this case the element has electrodes which extend on the side-walls of the mesa and make ohmic contact to the p-type and n-type regions respectively of the body.

It will also be evident that other metals than gold and chromium may be used to form the electrodes, for example aluminium or silver, and that the detector substrate may be of material other than sapphire. Thus, for example the insulating substrate 22 may be of for example alumina, silicon or beryllia.

I claim:
1. An infra-red detector device having at least one detector element and comprising:
   a substrate having a major surface;
   a body of cadmium mercury telluride which is sensitive to infra-red radiation mounted on the major surface of the substrate, at least a portion of the body being in the form of a mesa on a major surface of the body which is remote from the substrate which mesa includes an active area of the detector element and has a top surface and at least two side walls; and
   a plurality of separate, metal layer electrodes which are disposed on the body in contact with the mercury cadmium telluride to define, between the electrodes, a current carrying path through the active area of the mesa and which extend onto a part of the major surface of the substrate beyond the body to provide connections to the detector element;
   wherein each of the electrodes contacts the body at a side wall of the mesa without contacting the top surface of the mesa and the contacted side walls of the mesa are sufficiently steep so that said current carrying path passes through the bulk of the mesa between its side walls.

2. A device as claimed in claim 1 wherein the detector element further comprises a passivating layer disposed over the top surface of the mesa and adjoined at its edges by the separate electrodes.

3. A device as claimed in claim 2 comprising a plurality of separate mesas of infra-red sensitive cadmium mercury telluride upstanding on the major surface of the body and a metal layer deposited on the surface of the body between at least two of the mesas which forms an intermediate common electrode which contacts side walls of those mesas without contacting the top surfaces of those mesas.

4. A device as claimed in claim 1 wherein the side walls of the mesa have a slope of at least 75° as measured relative to a major surface of the substrate.

5. A device as claimed in claim 1 wherein the height of the side walls of the mesa is less than the thickness of the body whereby the mesa is upstanding on the remainder of the body, and the metal layer electrodes are disposed on both the side walls of the mesa and on the surface of the remainder of the body.

6. A device as claimed in claim 1 wherein the height of the side walls of the mesa is equal to the thickness of the body whereby the contact between the electrodes and the body is formed wholly by the metal layer on the side walls of the mesa.

7. A device as claimed in claim 1 wherein the electrodes comprise a first layer of chromium in contact with the cadmium mercury telluride and a second layer of gold, which is thicker than the first layer and overlays the first layer.

* * * * *